United States Patent [19]

Nossek

[11] 4,354,169
[45] Oct. 12, 1982

[54] SWITCHED-CAPACITOR FILTER CIRCUIT HAVING AT LEAST ONE SIMULATED INDUCTANCE HAVING CONTROLLED SWITCHES, CAPACITORS, AND AN AMPLIFIER

[75] Inventor: Josef Nossek, Munich, Fed. Rep. of Germany

[73] Assignee: Siemens Aktiengesellschaft, Berlin & Munich, Fed. Rep. of Germany

[21] Appl. No.: 223,032

[22] Filed: Jan. 7, 1981

[30] Foreign Application Priority Data

Jan. 21, 1980 [DE] Fed. Rep. of Germany ....... 3001969

[51] Int. Cl.³ ............................................. H03H 11/48
[52] U.S. Cl. .................................... 333/173; 333/214; 330/107
[58] Field of Search .................. 333/173, 214; 330/51, 330/107; 307/520

[56] References Cited

U.S. PATENT DOCUMENTS 4,179,665 12/1979 Gregorian ....................... 333/173 X

OTHER PUBLICATIONS

"Switched-Capacitor Filter Design Using the Bilinear z-Transformer", IEEE Transactions on Circuits and Systems, vol. CAS-25, No. 12, Dec., 1978, pp. 1039 through 1044.
"Switched Capacitor Circuits Bilinearly Equivalent to Floating Inductor or F.D.N.R.", Electronics Letters, Feb. 1, 1979, vol. 15, No. 3, pp. 87–88.

Primary Examiner—Paul L. Gensler
Attorney, Agent, or Firm—Hill, Van Santen, Steadman, Chiara & Simpson

[57] ABSTRACT

An easily integratable switched-capacitor filter circuit which can be employed to simulate a parallel resonance circuit has an operational amplifier having an inverting input connected to a first circuit node through a first switch, a capacitor interconnected between the first circuit node and a reference potential, a third switch interconnected between the first circuit node and a second circuit node, a capacitor interconnected between the second circuit node and the reference potential, a third switch interconnected between the second circuit node and the output of the operational amplifier, a fourth switch interconnected between the output of the operational amplifier and the first circuit node, and a fifth switch interconnected between the first circuit node and a non-grounded input terminal. The switches are respectively operated by four sequential non-overlapping clock phases such that the third and fifth switches are closed during the first clock phase, the first switch is closed during the second clock phase, the fourth switch is closed during the third clock phase, and the second switch is closed during the fourth clock phase.

5 Claims, 6 Drawing Figures

SWITCHED-CAPACITOR FILTER CIRCUIT HAVING AT LEAST ONE SIMULATED INDUCTANCE HAVING CONTROLLED SWITCHES, CAPACITORS, AND AN AMPLIFIER

RELATED APPLICATION

The present application is related to my co-pending application Ser. No. 223,033, filed simultaneously herewith.

BACKGROUND OF THE INVENTION

The present invention relates to switched-capacitor filter circuits and in particular to such a circuit having at least one simulated inductance and having a number of controlled switches and capacitors as well as an operational amplifier.

Switched-capacitor (SC) filters are known from the article "Switched-Capacitor Filter Design Using the Bilinear z-Transform" in the periodical "IEEE Transactions on Circuits and Systems", Vol. Cas-25, No. 12. December, 1978, pages 1039 through 1044 as well as from the article "Switched-Capacitor Circuits Bilinearly Equivalent to Floating Inductor or F.D.N.R." in the periodical "Electronics Letters", Feb. 1, 1979, Vol. 15, No. 3, pages 87 and 88. Such filters do not process time-continuous analog signals in the true sense, but rather process time-discrete signals which exist in the form of samples, which samples are generated according to a sampling frequency F by the relationship $T=1/F$, where T is the sampling period. Circuits for generating such samples are known to those skilled in the art and are not explained in detail herein. Such sampling circuits may be pre- or post-connected to the known circuits illustrated, so that samples derived from an analog signal are supplied to the filter circuit at its input side and the signals available at the output side are re-converted into time-continuous analog signals. The significant technical advantage of such filters is that coils are simulated by means of active circuit elements and capacitors, which are suitable for the monolithic integration of larger filter circuits. Conventional operational amplifiers are predominantly employed as the amplifiers in those circuits and accordingly design objectives are to achieve the smallest possible number of circuit elements while still insuring the stability of such circuits.

In the aforementioned known circuits, the inverting input of the amplifier is connected via a capacitor to the output of the amplifier, a type of connection sometimes referred to as "counter-coupling" or feedback connection. Some operational amplifiers employed are at times not counter-coupled or may require a high common mode rejection, because the inverting input of the operational amplifier is briefly not counter-coupled during certain switching phases, or the non-inverting input of the amplifier is not always held at ground potential. Moreover, the realization of the capacitors in such circuits is generally undertaken by metal-oxide-semiconductor (MOS) technology and the unavoidable ground capacitance associated with every floating MOS capacitor can lead to significant disruptions of the filter function.

A switched-capacitor filter circuit having at least one simulated inductor which can be employed both as a floating as well as a single-sided grounded coil and in which disruptions occurring due to switching operations are minimized is disclosed and claimed in my co-pending U.S. application Ser. No. 173,759, filed July 30, 1980 corresponding to German application P 29 32 419.4, filed in Germany on Aug. 9, 1979.

SUMMARY OF THE INVENTION

It is an object of the present invention to provide a switched-capacitor filter circuit which simulates active coils and can be employed to simulate a parallel resonance circuit.

It is a further object of the present invention to provide such a circuit which can simulate both floating coils as well as coils which are grounded on one side.

It is a further object of the present invention to provide a switched-capacitor filter circuit wherein disturbances resulting from the switching processes are minimized.

The above objects are inventively achieved in a switched-capacitor filter circuit having an operational amplifier with an inverting input which has a first switch connected thereto leading to a first circuit node from which a capacitor is connected to a reference potential. The output of the amplifier is connected to the first node by two paths, one path being through second and third switches and the other path being through a fourth switch. A second circuit node is disposed between the second and third switches and a capacitor is connected from the second node to the reference potential. A fifth switch is interconnected between the first circuit node and a non-grounded input terminal. The circuit is operated by four sequential clock phases having non-overlapping duty times. The first clock phase closes the third and fifth switches, the second clock phase closes the first switch, the third clock phase closes the fourth switch and the fourth clock phase closes the second switch.

By appropriately selecting the values of the various capacitors, the circuit can be operated either as a one-sided simulated inductance or a parallel resonance circuit. The parallel resonance circuit can be constructed so as to have a resonance frequency which is greater than or less than one-sixth of the sampling frequency.

DESCRIPTION OF THE PREFERRED EMBODIMENTS

Figure 1:
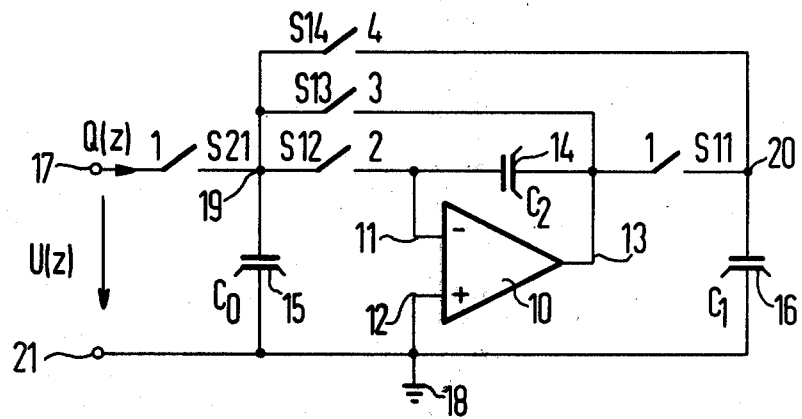
FIG. 1 is a circuit diagram of a switched-capacitor filter circuit constructed in accordance with the principles of the present invention.

A two-pole switched-capacitor filter circuit is shown in FIG. 1 which is constructed in accordance with the principles of the present invention having a first input terminal 17 and a second input terminal 21. An input voltage U(z) appears across the two terminals 17 and 21 and a charge Q(z) flows into the circuit. The terminal 21 is connected to a reference potential or ground 18. The active element in the circuit consists of an operational amplifier 10 which has an inverting input 11, a non-inverting input 12, and an output 13. The non-inverting input 12 is connected to the reference potential 18.

The circuit has two circuit nodes 19 and 20 disposed respectively on the input and output sides of the amplifier 10. The circuit node 19 is connected to the reference potential 18 through a capacitor 15 and the second circuit node 20 is connected to the reference potential 18 through a capacitor 16. The output 13 of the operational amplifier 10 is connected through a capacitor 14 to the inverting input 11 and serves as a feedback or counter-coupled capacitor. The capacitors 14, 15 and 16 are respectively designated as having capacitance values $C_2$, $C_0$ and $C_1$.

The circuit shown in FIG. 1 also includes a series of clock-pulse controlled means such as switches for selective connection of the input and output 11 and 13 of the amplifier 10 to various circuit points. A first switch S12 is interconnected between the input 11 and the node 19, a second switch S14 is interconnected between the nodes 19 and 20, a third switch S11 is interconnected between the second node 20 and the output 13 of the operational amplifier 10 and a fourth switch S13 is interconnected between the output 13 and the first node 19. A fifth switch S21 is interconnected between the non-grounded first input terminal 17 and the node 19.

Figure 2:
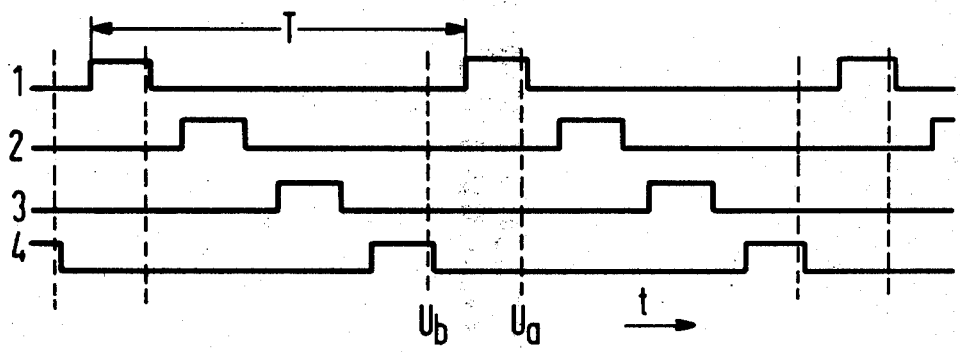
FIG. 2 is a diagram of four clock phases employed in the operation of the circuits shown in FIGS. 1, 5 and 6.

The operation of the circuit shown in FIG. 1 is governed by the clock phases shown in the clock diagram in FIG. 2 having a horizontal axis representing time t. The individual clock phases are referenced in FIG. 2 at 1, 2, 3 and 4, and the same numerals are also known in FIG. 1 next to the respective switches which are closed during the duty time of a particular clock phase. Each clock phase has the same period T and the duty times, and thus the switch closure durations, do not overlap. The state following switching is represented in FIG. 2 at $U_a$ and the state prior to switching is represented as $U_b$. Thus, in the exemplary embodiment shown in FIG. 1 the switches S11 and S21 are closed during the clock phase 1, the switch S12 is closed during the clock phase 2, the switch S13 is closed during the clock phase 3, and finally the switch S14 is closed during the clock phase 4.

As described in greater detail below, the clock phases shown in FIG. 2 can also be used to operate the circuits shown in FIGS. 5 and 6 wherein elements identical to those shown in FIG. 1 are identically referenced.

One of the advantages of the circuit shown in FIG. 1 is that while the number of components is maintained as small as possible, it is still possible to simulate an inductance which is grounded on one side and the circuit can also be utilized to simulate a floating inductance or parallel resonance circuit without the necessity of increasing the number of individual clock phases.

The values of the capacitors 14 and 16 are preferably selected such that $C_2 = C_0/4$ and $C_1 = C_0/3$, where $C_0$ is the capacitance of the capacitor 15.

Figure 3:
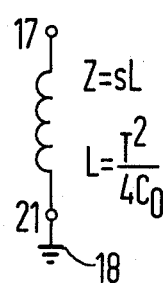
FIG. 3 is an equivalent circuit for the circuit shown in FIG. 1 when operated as a single-sided inductance.

The equivalent circuit for operation of the circuit shown in FIG. 1 to simulate a single-sided inductance is shown in FIG. 3 having an impedance $Z = sL$ between the non-grounded terminal 17 and the grounded terminal 21 where s is the complex factor. The equivalent circuit simulates an inductance $L = T^2/4C_0$ so that the capacitance $C_0$ of the capacitor 15 can be directly determined from the inductance value L which is to be simulated over the sampling period T of the system.

Figure 4:
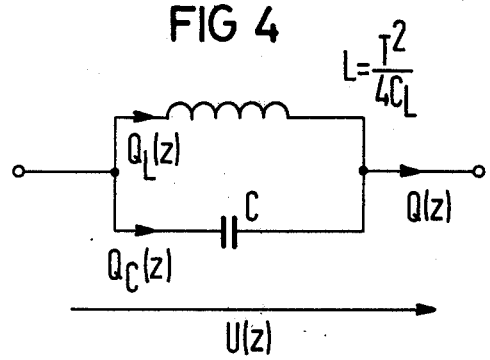
FIG. 4 is an equivalent circuit for the circuit shown in FIG. 1 when operated as a parallel resonance circuit.

An equivalent circuit is shown in FIG. 4 representing operation of the circuit shown in FIG. 1 as a floating parallel resonance circuit. The equivalent circuit shown in FIG. 4 shows a charge $Q_L(z)$ flowing in the inductance L and a charge $Q_C(z)$ in the capacitor C. The total charge is referenced Q(z) which results in a voltage drop U(z). This parallel resonance circuit can be realized with the circuit shown in FIG. 1, that is, the charge Q(z) is received at the input terminal 17 and a voltage drop U(z) occurs across the terminals 17 and 21, when the capacitors 14, 15 and 16 are selected with the following capacitance values:

$$C_0 = C + C_L,\ C_1 = C_0^2/(3C_L - C),\ C_2 = C_0^2/4C_L,$$
$$C_L = T^2/4L.$$

Figure 5:
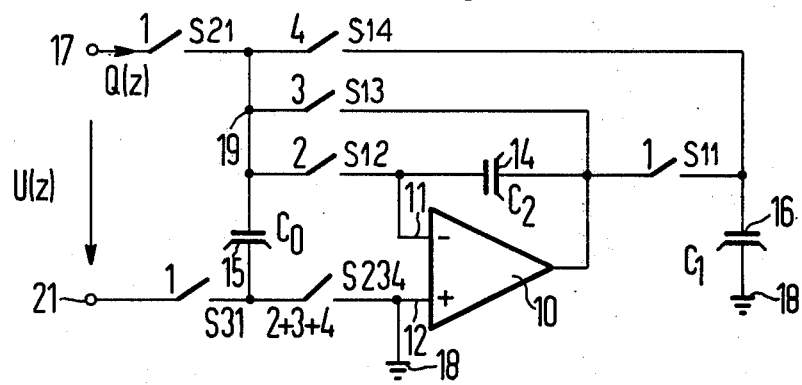
FIG. 5 is an embodiment of the circuit shown in FIG. 1 for simulating a parallel resonance circuit having a resonance frequency which is less than one-sixth of the sampling frequency.

A further embodiment of the circuit shown in FIG. 1 is illustrated in FIG. 5 which simulates a floating inductance, that is, an inductance of the type shown in the equivalent circuit of FIG. 3 without connection of the terminal 21 to a reference potential, or can alternatively be employed as a parallel resonance circuit having the equivalent circuit shown in FIG. 4 and having a resonance frequency which is less than one-sixth of the sampling frequency.

In contrast to the circuit shown in FIG. 1, in the circuit of FIG. 5 the second input terminal 21 is not directly connected to the reference potential 18, but instead a sixth switch S31 is inserted between the capacitor 15 and the terminal 21 which is closed during block phase 1. A seventh switch S234 is interconnected between the capacitor 15 and the non-inverting input 12 of the amplifier 10 which leads to the reference potential 18, the seventh switch S234 being closed during the clock phases 2, 3 and 4.

Figure 6:
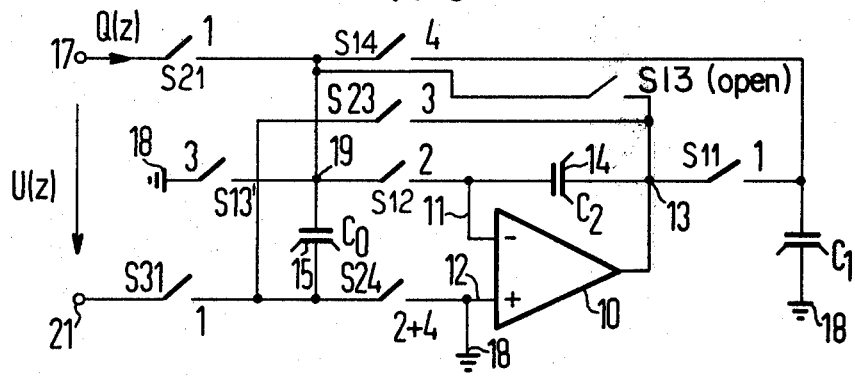
FIG. 6 is an embodiment of the circuit shown in FIG. 1 for simulating a parallel resonance circuit having a resonance frequency which is greater than one-sixth of the sampling frequency.

The embodiment shown in FIG. 6 essentially reverses the polarity of the capacitor 15 and when capacitance values are selected in accordance with the above formulae a floating parallel resonance circuit is achieved which has a resonance frequency greater than one-sixth of the sampling frequency. Comparing the circuit shown in FIG. 6 to that shown in FIG. 1, the circuit of FIG. 6 has the output 13 of the operational amplifier 10 no longer connected to the circuit node 19 via the switch S13, but rather in FIG. 6 is connected to the sixth switch S31 through an eighth switch S23 which is closed during clock phase 3. In contrast to the circuit shown in FIG. 5, the circuit of FIG. 6 has a ninth switch S24 which is closed during clock phases 2 and 4 in place of the switch S234. In order to reverse the polarity of the capacitor 15 the switch S13' is utilized which connects the node 19 to the reference potential 18 during clock phase 3. The switches S13 in FIGS. 1 and 5 and the switch S13' in FIG. 6 may be considered in combination as a means for selectively connecting the first node 19 to either the output 13 of the amplifier 10 or to the reference potential 18 during clock phase 3, depending upon the type of circuit which is desired to be simulated. The switch S13', although not shown in FIGS. 1 and 5, may still be considered present in those FIGS., but is always maintained in an open state during the operation of those circuits. Similarly, the switch S13 may be considered to be present in the circuit shown in FIG. 6, but is likewise always in an open state during the operation of that circuit.

As mentioned above, each of the circuits shown in FIGS. 1, 5 and 6 have the advantage that the number of switching elements is maintained as small as possible, so that the required number of clock phases can also be maintained as small as possible which renders the circuits suitable for integrated construction. In all of the circuits the capacitor 14 is disposed directly between the output 13 and the inverting input 11 of the operational amplifier 10, so as to always provide negative feedback during the switching processes of the individual switches. As also described above, these circuits render possible the simulation of parallel resonance circuits without the addition of further substantial circuitry.

Although modifications and changes may be suggested by those skilled in the art it is the intention of the inventor to embody within the patent warranted hereon all changes and modifications as reasonably and properly come within the scope of his contribution to the art.

I claim as my invention:

1. In a switched-capacitor filter circuit which may be adapted to simulate a single-sided inductor or a parallel resonance circuit having a resonance frequency greater than one-sixth of the filter circuit sampling frequency or a parallel resonance circuit having a resonance frequency which is less than said sampling frequency, said filter circuit having an operational amplifier with a feedback capacitor interconnected between an output and an inverting input thereof, said amplifier also having a non-inverting input connected to a reference potential, said filter circuit operated by first, second, third, and fourth cyclically sequential clock phases having non-overlapping duty times and identical periods, and said filter circuit further having first and second input terminals, the improvement comprising:
   a first switch which is closed during said second clock phase and which is interconnected between the inverting input of said amplifier and a first circuit node;
   a first capacitor interconnected between said first circuit node and said second input terminal and the reference potential;
   a second switch which is closed during said fourth clock phase and which is interconnected between said first circuit node and a second circuit node;
   a second capacitor interconnected between said second circuit node and the reference potential;
   a third switch which is closed during said first clock phase and which is interconnected between the output of said operational amplifier and said second circuit node;
   a fourth switch which is closed during said third clock phase if said filter circuit is to simulate a single-sided inductor or a parallel resonance circuit having a resonance frequency which is less than one-sixth of said sampling frequency, said fourth switch otherwise always remaining open, said fourth switch being interconnected between the output of said operational amplifier and said first circuit node; and
   a fifth switch which is closed during said first clock phase and which is interconnected between the first input terminal and said first circuit node.

2. The improvement of claim 1 wherein said feedback capacitor has a capacitance which is one-fourth of the capacitance of said first capacitor, and said second capacitor has a capacitance which is one-third of the capacitance of said first capacitor for operating the filter circuit as a single-sided inductor.

3. The improvement of claim 1 for operating said filter circuit as a parallel resonance circuit simulating an inductance L and a capacitance C, and wherein said first capacitor has a capacitance $C_0$, said second capacitor has a capacitance $C_1$, and said feedback capacitor has a capacitance $C_2$ selected in accordance with the following equations:

$$C_0 = C + C_L, \ C_1 = C_0^2/(3C_L - C), \ C_2 = C_0^2/4C_L,$$
$$C_L = T^2/4L.$$

where T is the sampling period which is equal to the reciprocal of said sampling frequency.

4. The improvement of claim 1 for operating said filter circuit for simulating a parallel resonance circuit having a resonance frequency which is less than one-sixth of said sampling frequency further comprising:
   a sixth switch which is closed during said second and third and fourth clock phases and which is interconnected between said reference potential and said first capacitor; and
   a seventh switch which is closed during said first clock phase and which is interconnected between said second input terminal and said first capacitor.

5. The improvement of claim 1 for operating said filter circuit for simulating a parallel resonance circuit having a resonance frequency which is greater than one-sixth of said sampling frequency further comprising:
   a sixth switch which is closed during said second and fourth clock phases and which is interconnected between said first capacitor and said reference potential;
   a seventh switch which is closed during said first clock phase and which is interconnected between said second input terminal and said first capacitor;
   an eighth switch which is closed during said third clock phase and which is interconnected between said first circuit node and the reference potential; and
   a ninth switch which is closed during said third clock phase and which is interconnected between the output of said operational amplifier and a side of said first capacitor opposite to the side thereof connected to said first circuit node.

* * * * *